(12) United States Patent
Karns et al.

(10) Patent No.: US 11,726,121 B2
(45) Date of Patent: Aug. 15, 2023

(54) AUTOMATED RESONANT WAVEGUIDE CAVITY SYSTEM FOR COMPLEX PERMITTIVITY MEASUREMENTS

(71) Applicant: Battelle Memorial Institute, Columbus, OH (US)

(72) Inventors: Duane Karns, Mays Landing, NJ (US); James Weatherall, Linwood, NJ (US); Jeffrey Barber, Vineland, NJ (US); Barry Smith, Galloway, NJ (US)

( * ) Notice: Subject to any disclaimer, the term of this patent is extended or adjusted under 35 U.S.C. 154(b) by 50 days.

(21) Appl. No.: 17/539,582

(22) Filed: Dec. 1, 2021

(65) Prior Publication Data
US 2022/0170972 A1 Jun. 2, 2022

Related U.S. Application Data

(60) Provisional application No. 63/120,443, filed on Dec. 2, 2020.

(51) Int. Cl.
| | | |
|---|---|---|
| *G01R 27/04* | (2006.01) | |
| *G01R 27/32* | (2006.01) | |
| *G01R 27/26* | (2006.01) | |
| *H01P 7/06* | (2006.01) | |
| *G01N 22/00* | (2006.01) | |
| *G01N 22/04* | (2006.01) | |
| *G01N 22/02* | (2006.01) | |
| *G01R 33/60* | (2006.01) | |

(52) U.S. Cl.
CPC ......... *G01R 27/2658* (2013.01); *G01N 22/00* (2013.01); *G01N 22/02* (2013.01); *G01N 22/04* (2013.01); *H01P 7/06* (2013.01); *G01R 27/04* (2013.01); *G01R 33/60* (2013.01)

(58) Field of Classification Search
CPC .... G01R 27/2658; G01R 27/04; G01R 33/60; G01N 22/00; G01N 22/04; G01N 22/02; H01P 7/06; H01P 11/008
USPC ... 324/76.11–76.83, 459, 600, 629, 633, 636
See application file for complete search history.

(56) References Cited

U.S. PATENT DOCUMENTS

| | | | |
|---|---|---|---|
| 2005/0225332 A1* | 10/2005 | Schroder | H01P 1/30 324/636 |
| 2019/0072595 A1* | 3/2019 | Fruehling | G01R 23/16 |
| 2021/0088457 A1* | 3/2021 | Karns | G01N 22/00 |

* cited by examiner

*Primary Examiner* — Raul J Rios Russo
(74) *Attorney, Agent, or Firm* — Volpe Koenig (57) ABSTRACT

An automated resonant waveguide cavity system for determining one or complex permittivity measurements of a sample is provided. The automated resonant waveguide cavity system includes a resonant cavity, a waveguide coupled to the resonant cavity, a programmable network analyzer (PNA) coupled to the waveguide, and a computing device. The computing device includes a memory storing processor executable code for a determination engine and a processor executing the processor executable code to cause the determination engine to obtain data from the PNA. The data is respective to the sample within the resonant cavity. The determination engine further integrates a plurality of analytical and modeling functions in determining the complex permittivity values of the sample from the data.

20 Claims, 11 Drawing Sheets

Analysis of HDPE fixture: $\varepsilon' = 2.34$, $\varepsilon'' = 0.003$, $\sigma_{wall} = 1.05 \times 10^5$

| Measured Data | | COMSOL | Analytical Solution | | | | | |
|---|---|---|---|---|---|---|---|---|
| Mode | Freq (GHz) | $Q_L$ | $Q_L$ | $Q_d$ | $Q_w$ | $Q_c$ | $Q_L$ | $Q_L$ Dispersion | % Error (Meas/Anal) |
| $TE_{102}$ | 18.9 | 165.3 | 167.3 | 780 | 253 | 1273 | 166 | 166 | 1.6 |
| $TE_{301}$ | 24.1 | 571.8 | 194.1 | 780 | 1324 | 7465 | 461 | 532 | 9.7 |
| $TE_{103}$ | 26.8 | 182.2 | 152.4 | 780 | 293 | 517 | 151 | 160 | 13.7 |
| $TE_{302}$ | 28.5 | 347.2 | 196.4 | 780 | 714 | 1273 | 288 | 330 | 8.9 |
| $TM_{120}$ | 30.9 | 184.9 | 150.4 | | | | | | |
| $TE/TM_{121}$ | 32.2 | 232.9 | 128.8 | | | | | | |

AUTOMATED RESONANT WAVEGUIDE CAVITY SYSTEM FOR COMPLEX PERMITTIVITY MEASUREMENTS

CROSS REFERENCE TO RELATED APPLICATIONS

This application claims priority from U.S. Provisional Patent Application No. 63/120,443, entitled "AUTOMATED RESONANT WAVEGUIDE CAVITY SYSTEM FOR COMPLEX PERMITTIVITY MEASUREMENTS," filed on Dec. 2, 2020, which is hereby incorporated by reference as if set forth in full in this application for all purposes.

STATEMENT REGARDING FEDERALLY SPONSORED RESEARCH OR DEVELOPMENT

This invention was made with Government support under Task Order 28—HSHQDC-15-J-00395 awarded by U.S. Department of Homeland Security. The Government has certain rights in this invention.

BACKGROUND

Permittivity of a material is a crucial physical characteristic that determines how the material interacts with electromagnetic fields. Determining the permittivity can quantify reflectance in imaging systems that use millimeter wavelength radiation. However, permittivity is frequency dependent and has to be measured at the frequency related to its application. Further, determining the permittivity is a time-consuming and labor-intensive process that requires the configuration of measurement mechanisms, samples, and data-collection and analysis hardware. Accordingly, there is a need for a system and method for automating permittivity measurements.

SUMMARY

According to one or more embodiments, an automated resonant waveguide cavity system for determining one or complex permittivity measurements of a sample is provided. The automated resonant waveguide cavity system comprising: a resonant cavity; a waveguide coupled to the resonant cavity; a programmable network analyzer (PNA) coupled to the waveguide; a computing device comprising at least one memory storing processor executable code for a determination engine and at least one processor executing the processor executable code to cause the determination engine to: obtain data from the PNA, the data being respective to the sample within the resonant cavity, and integrate a plurality of analytical and modeling functions in determining the one or more complex permittivity values of the sample from the data According to one or more embodiments, a method for determining one or more complex permittivity values of a sample is provided. The method is implemented by a determination engine stored as processor executable code in a memory of a computing device. The processor executable code is executed by at least one processor of the computing device. The method includes obtaining data from a programmable network analyzer (PNA) coupled to a waveguide and a resonant cavity. The data is respective to the sample within the resonant cavity. The method includes integrating a plurality of analytical and modeling functions in determining the one or more complex permittivity values of the sample from the data.

According to one or more embodiments, the above system and/or method embodiments can be implemented as one or more of computer program products, apparatuses, and devices.

These and other features and advantages will become apparent from the following detailed description of illustrative embodiments thereof, which is to be read in connection with the accompanying drawings.

BRIEF DESCRIPTION OF THE DRAWING(S)

The following description will provide details of example embodiments with reference to the following figures wherein.

DETAILED DESCRIPTION OF THE PREFERRED EMBODIMENT(S)

Disclosed herein are systems and methods related to complex permittivity measurements. That is, permittivity is a complex quantity and is referred herein as complex permittivity. Complex permittivity includes a real part associated with a wave phase velocity in a material of a sample and an imaginary part associated with absorption in the material. Because conventional techniques are deficient at measuring complex permittivity (e.g., because conventional techniques are not suited for volatile types of materials, require extensive calibration, and time-consuming physical configurations and adjustments), one or more embodiments herein provide automated resonant waveguide systems and methods for measuring complex permittivity in samples of interest. For ease of explanation and brevity, the automated resonant waveguide systems and methods are collectively referred to as an "automated resonant waveguide system."

For example, some materials of the samples of interest (e.g., powders of organic materials) are low loss. The automated resonant waveguide system provides a resonant cavity that is particularly useful in detecting a small imaginary component in weakly absorbing materials, which is necessary to characterize semi-transparent objects. The automated resonant waveguide system, by using the resonant cavity with the weakly absorbing materials, detect a reflection that is near unity, except in the vicinity of an electromagnetic resonance in the resonant cavity, where the reflection decreases sharply. Therefore, the reflection coefficient is measured, by the automated resonant waveguide system, as a function of frequency using a network analyzer (of the automated resonant waveguide system) to determine the resonant frequencies and associated width of the resonance. These values can be related through an electromagnetic simulation/model (executed by the automated resonant waveguide system) to the real and imaginary components of a complex permittivity of the materials filling the resonant cavity. Further, for computational reduction, any effects of the automated resonant waveguide system can be accounted for to assure that the result extracted from the electromagnetic simulation/model corresponds with a physical measurement. To verify the results of the electromagnetic simulation/model, an analytical solution can be used by the automated resonant waveguide system as well.

Figure 1:
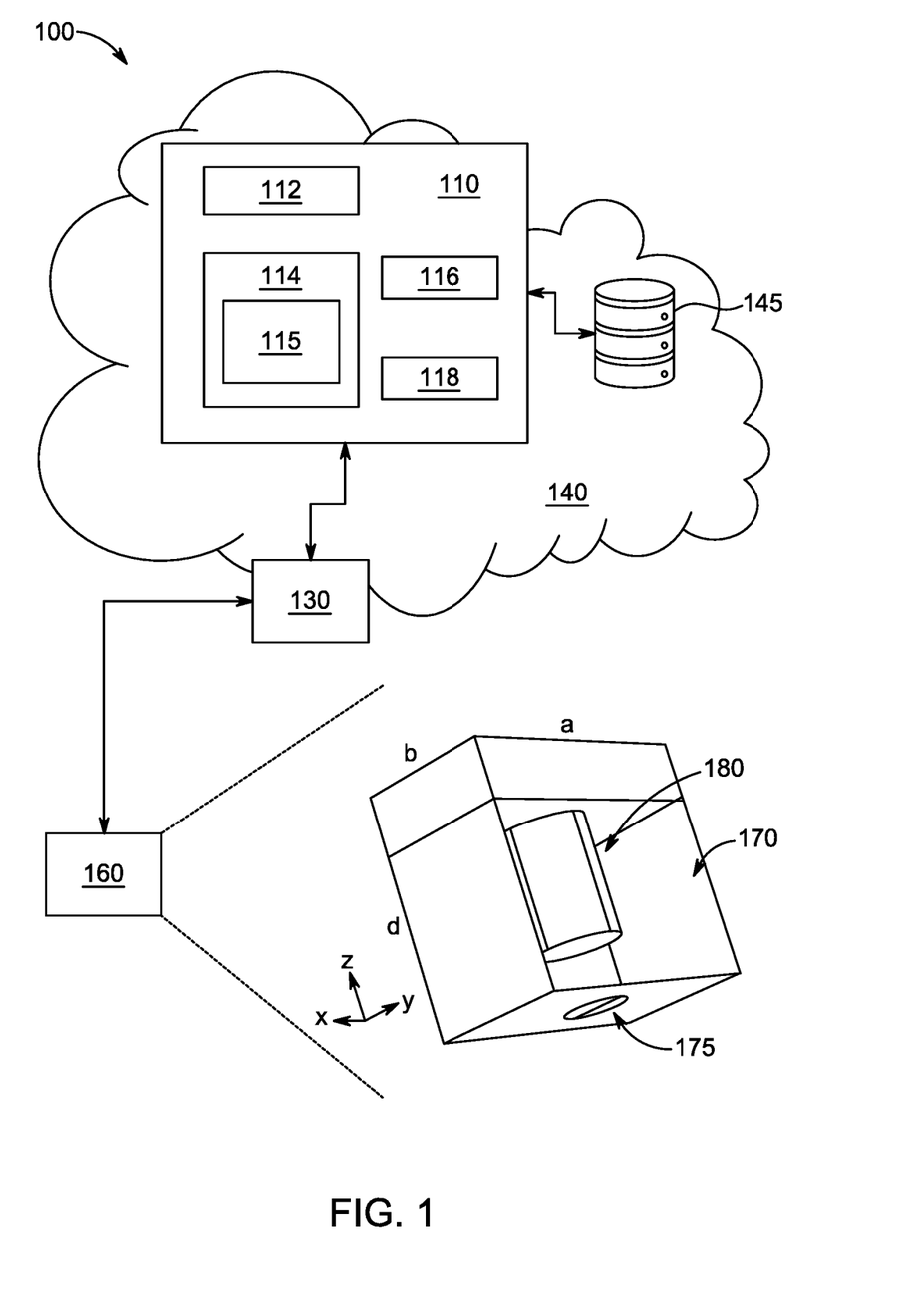
FIG. 1 depicts a diagram in accordance with one or more embodiments.

Turning now to FIG. 1, a diagram 100 of a system (e.g., the automated resonant waveguide system) in which one or more features of the disclosure subject matter can be implemented is illustrated according to one or more exemplary embodiments. The system includes hardware/software configurations, such as a computing device 110. The computing device 110 includes at least one processor 112, at least one memory 114 storing a determination engine 115 thereon, a display 116, one or more transceivers 118, and one or more controls 119. The system also includes hardware/software configurations, such as a programmable network analyzer (PNA) 130, a network 140, a server 145, and a waveguide 160 that is coupled to a resonant cavity 170 (with an aperture 175) for housing a sample 180. By way of example, the resonant cavity 170 can be of, but not limited thereto, a rectangular shape of dimensions a-b-c as further described herein.

According to an embodiment, the computing device 110, the PNA 130, and/or the server 145 can be any combination of software and/or hardware that individually or collectively store, execute, and implement execute computer instructions with the determination engine 115 and functions thereof. Further, the computing device 110, the PNA 130, and/or the server 145 can be an electronic, computer framework comprising and/or employing any number and combination of computing device and networks utilizing various communication technologies, as described herein. The computing device 110, the PNA 130, and/or the server 145 can be easily scalable, extensible, and modular, with the ability to change to different services or reconfigure some features independently of others. Note that, while the system illustrates that the computing device 110 and the PNA 130 are interconnected and in communication, each of the computing device 110 and the PNA 130 can store and execute the determination engine 115. As an example, the memory 114 stores these instructions for execution by the processor 112 so that the computing device 110 can receive and process signals from the PNA 130 and the waveguide 160. In this way, the processor 112 and the memory 114 are representative of processors and memories of the PNA 130 and/or the server 145.

The processor 112, also referred to as processing circuits, is coupled via a system bus to the memory 114 and various other components. The processor 112 may be any type of general or specific purpose processor, including a central processing unit (CPU), application specific integrated circuit (ASIC), field programmable gate array (FPGA), graphics processing unit (GPU), controller, multi-core processing unit, three dimensional processor, quantum computing device, or any combination thereof. The processor 112 may also have multiple processing cores, and at least some of the cores may be configured to perform specific functions. Multi-parallel processing may also be configured. In addition, processor 112 may be a neuromorphic circuit that includes processing elements that mimic biological neurons. The processor 112 can also be representative of cloud processing across the system.

The memory 114 is an example of a (non-transitory) computer readable storage medium, where a repository can be located/managed and/or software (e.g., the determination engine 115) can be stored.

According to one or more embodiments, the determination engine 115 can be configured in hardware, software, or a hybrid implementation for complex permittivity measurements. The determination engine 115 can be composed of modules that are in operative communication with one another, and to receive and pass information or instructions to other items of the system. The determination engine 115 can further include custom modules to perform application specific processes or derivatives thereof, such that the system may include additional functionality to the complex permittivity measurements.

According to one or more embodiments, the determination engine 115 can provide one or more interfaces, such as on behalf of the operating system or other application and/or directly as needed to determine/evaluate/analyze/provide complex permittivity measurements. The interfaces include, but are not limited to, user interfaces (UIs), graphic user interfaces (GUIs), internet browsers, window interfaces, and/or other visual interfaces for applications, operating systems, file folders, and the like.

According to one or more embodiments, the memory 114 of the computing device 110 can include instances other software applications, such as a cross-platform finite element analysis, solver, and multiphysics simulation software and/or a programming and numeric computing platform, that work in conjunction with or alongside the determination engine 115. Examples of other software applications include of COMSOL Multiphysics® ("COMSOL") applications, MATLAB® ("MATLAB") applications, Mathematic applications, ANSYS applications, and other simulation application packages that are configured to calculate and model the complex permittivity of a sample in a resonant cavity. COMSOL is a platform for physics-based modeling and simulation. Through COMSOL, one can conduct numerical analysis using finite element analysis techniques. COMSOL allows specialized modules to focus on particular problems of interest. For example, modules relevant for complex permittivity measurement include the RF Module, Optimization Module, and the MATLAB Livelink Module. Note that the systems and methods described herein are interoperable with other modeling packages and applications such as, but not limited to, Mathematic and ANSYS applications. Accordingly, wherever reference is made to COMSOL or MATLAB, note that another application having similar analytical and simulation functionality such as, but not limited to, ANSYS and the like could take their place within the scope of the embodiments described herein.

The display 165 can be any electronic device for the visual presentation, for example, of the complex permittivity measurements and/or GUIs. As an example, the display 165 can include a touchscreen that can be configured to accept inputs from a user.

The one or more transceivers 118 represents a transmitter and receiver integrated into a single device, one or more separate transmitters, and/or one or more separate receivers that can communicate and/or receive and pass information or instructions to other items of the system.

The one or more controls 119 can include elements that can be manipulated by a user, such as a touch pad, a mouse, a keyboard, a gesture recognition apparatus, knobs, buttons, or the like.

The network 140 can be a wired network, a wireless network, or include one or more wired and wireless networks. According to an embodiment, the network 140 is an example of a short-range network (e.g., local area network (LAN), or personal area network (PAN)). Information can be sent, via the network 140, between the computing device 110, the PNA 130, and/or the server 145 using any one of various short-range wireless communication protocols, such as Bluetooth, Wi-Fi, Zigbee, Z-Wave, near field communications (NFC), ultra-band, Zigbee, or infrared (IR). Further, the network 140 is an example of one or more of an Intranet, a local area network (LAN), a wide area network (WAN), a metropolitan area network (MAN), a direct connection or series of connections, a cellular telephone network, or any other network or medium capable of facilitating communication between the computing device 110, the PNA 130, and/or the server 145. Information can be sent, via the network 140, using any one of various long-range wireless communication protocols (e.g., TCP/IP, HTTP, 3G, 4G/LTE, or 5G/New Radio). Note that for the network 140, wired connections can be implemented using Ethernet, Universal Serial Bus (USB), RJ-11 or any other wired connection and wireless connections can be implemented using Wi-Fi, WiMAX, and Bluetooth, infrared, cellular networks, satellite or any other wireless connection methodology.

The server 145 can database (e.g., an SQL database) and/or another storage mechanism (such as an extension of the repository of the memory 114).

The waveguide 160 can be any physical structure that guides waves, such as electromagnetic waves or sound, with minimal loss of energy. The waveguide 160 can include any number of transducers that sense and convert the waves them to signals for processing by the PNA 130 and/or the computing device 110. The waveguide 160 can restrict transmission of the waves to one direction and/or resonate the waves. The waveguide 160 can include or be coupled to the resonant cavity 170. The resonant cavity 170 can be a closed or largely closed structure to confine the waves. The resonant cavity 170 can be any shape, such as rectangularly or cylindrically shaped.

In the example system of FIG. 1, the resonant cavity 170 includes an aperture 175. The aperture 175 can enable an input from the waveguide 160 to the resonant cavity 170. The aperture 175 can be coupled to a cable of the waveguide 160. The aperture 175 can enable waves not absorbed by the sample 180 (e.g., a real part associated with a wave phase velocity in a material of the sample 180) to be detected by one or more transducers of the waveguide 160 or to be transmit externally. According to one or more embodiments, during measurements, a High-Density Polyethylene (HDPE) plastic fixture can fill the resonant cavity 170 and encapsulate the sample 180, such as in a center region of the resonant cavity 170. According to one or more embodiments, a centered coupling element in an a-b plane of the resonant cavity 170 couples the sample 180 with the resonant cavity 170. Note that the centered coupling element can be configured behind the sample 180, and is therefore both shown and hidden in FIG. 1.

The sample 180 is a sample of interest that is being tested/analyzed/measured by the system. The sample can be in any shape or powder and is shown as a nonlimiting cylindrical sample.

According to one or more embodiments, a GUI as generated by the determination engine 115 is configured to provide a control and configuration interface for constituent elements of any hardware configuration of the system used to measure a complex permittivity of the sample 180. For instance, the GUI of the determination engine 115 on the computing device 110 can contain interactive elements for configuring and controlling the PNA 130, as well as for collecting data from the PNA 130. The determination engine 115 utilizes the GUI to import the data from the PNA 130 into COMSOL and, thereafter, to automatically transmit the output of COMSOL into MATLAB. In accordance with one or more embodiments, the determination engine 115 on the computing device 110 can execute an algorithm to repeat a process of data collection and transmission until the COMSOL model converges.

According to one or more embodiments, the determination engine 115 of the system automates measurements of complex permittivity of the sample 180 in a millimeter-wave regime and provides measurements for display by a GUI of the PNA 130 and/or a GUI on the display 116 of the computing device 110. In this regard, the GUI integrates varied processes required for a calculation of the complex permittivity for the sample 180 in the resonant cavity 170 using one or more of the PNA 130, COMSOL, and MATLAB. The GUI and the determination engine 115 simplify inputting values, configuring settings, and reviewing results. Thus, one or more technical effects, benefits, and advantages of the GUI and the determination engine 115 allows a user to perform measurement tasks in a few minutes (i.e., instead of an undertaking that would otherwise require a scientist to work for several days with conventional techniques). More particularly, the GUI and the determination engine 115 enable seamless, background execution (without any user interaction) of complicated tasks, such as configuring and controlling the PNA 130; collecting data from the PNA 130; importing data from the PNA 130 into a COMSOL; inputting an output of COMSOL into MATLAB; and running an optimization algorithm to repeat a process until COMSOL model converges.

Figure 2:
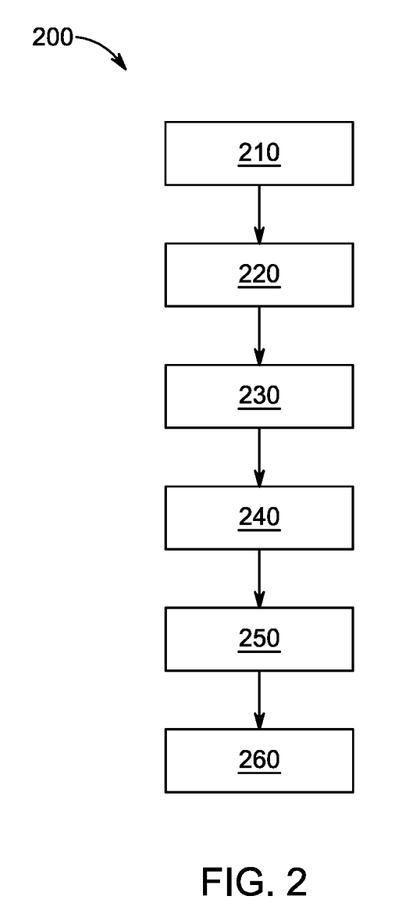
FIG. 2 depicts a method in accordance with one or more embodiments.

Turning now to FIG. 2, a method 200 is depicted according to one or more embodiments. The method 200, generally, includes identifying a complex permittivity of the sample 180. The method 200 can be implemented by the system (and more particularly the determination engine 115) to provide a simple easy to use solution that integrates MATLAB, COMSOL models, and the PNA 130 into a single platform, where each of the constituent components can all communicate with each other, hand data back and forth, and perform analysis algorithms based upon input from each other. The method 200 operates with respect to analyzing the sample 180.

The method 200 begins at block 210, where the determination engine 115 determines a reflection coefficient with the PNA 130. The reflection coefficient can be determined with reference to Equation 1.

$$r(f_0, Q_L, \ldots) = -1 + \frac{2K/(1+K)}{1 + i2q_L(f-f_0)/f_0} \quad \text{Equation 1}$$

At block 220, the determination engine 115 extracts a resonant frequency ($f_0$) and a Q-factor ($Q_L$). The resonant frequency ($f_0$) can be obtained with Equation 2, where m, n, and p are integers, and μ and ε are relative permeability and permittivity, respectively.

$$f_0(\varepsilon', \varepsilon'', \ldots) = \frac{c}{2\pi\sqrt{\mu\varepsilon}} \left( \frac{\pi^2 m^2}{a^2} + \frac{\pi^2 n^2}{b^2} + \frac{\pi^2 p^2}{d} \right)^{1/2} \quad \text{Equation 2}$$

The Q factor ($Q_L$) can be obtained with Equation 3.

$$Q_L(\varepsilon', \varepsilon'', \ldots) = \left( \frac{1}{Q_d} + \frac{1}{Q_w} + \frac{1}{Q_c} \right)^{-1} \quad \text{Equation 3}$$

At block 230, the determination engine 115 transmits $f_0$ and the $Q_L$ values to the COMSOL model to obtain the ε' and ε" values. Note that the resonant frequency analysis can be used to verify the results obtained from the electromagnetic simulation/model of the waveguide resonant cavity 170 (e.g., a rectangular waveguide resonant cavity). According to one or more embodiments, an analytical analysis by the determination engine 115 may not include the sample 180 of interest and, instead, assumes that the waveguide resonant cavity 170 is completely filled by HDPE.

According to one or more embodiments, the determination engine 115 can utilize one or more models in COMSOL, such as a full frequency swept model and an eigen-frequency solution. The full frequency swept model includes solving the COMSOL model for every frequency over a frequency range of interest, which provides accurate results while being demanding computationally. The eigen-frequency solution provides a gradient-based optimization technique, which converges on a solution for a single frequency and Q-factor.

Figure 3:
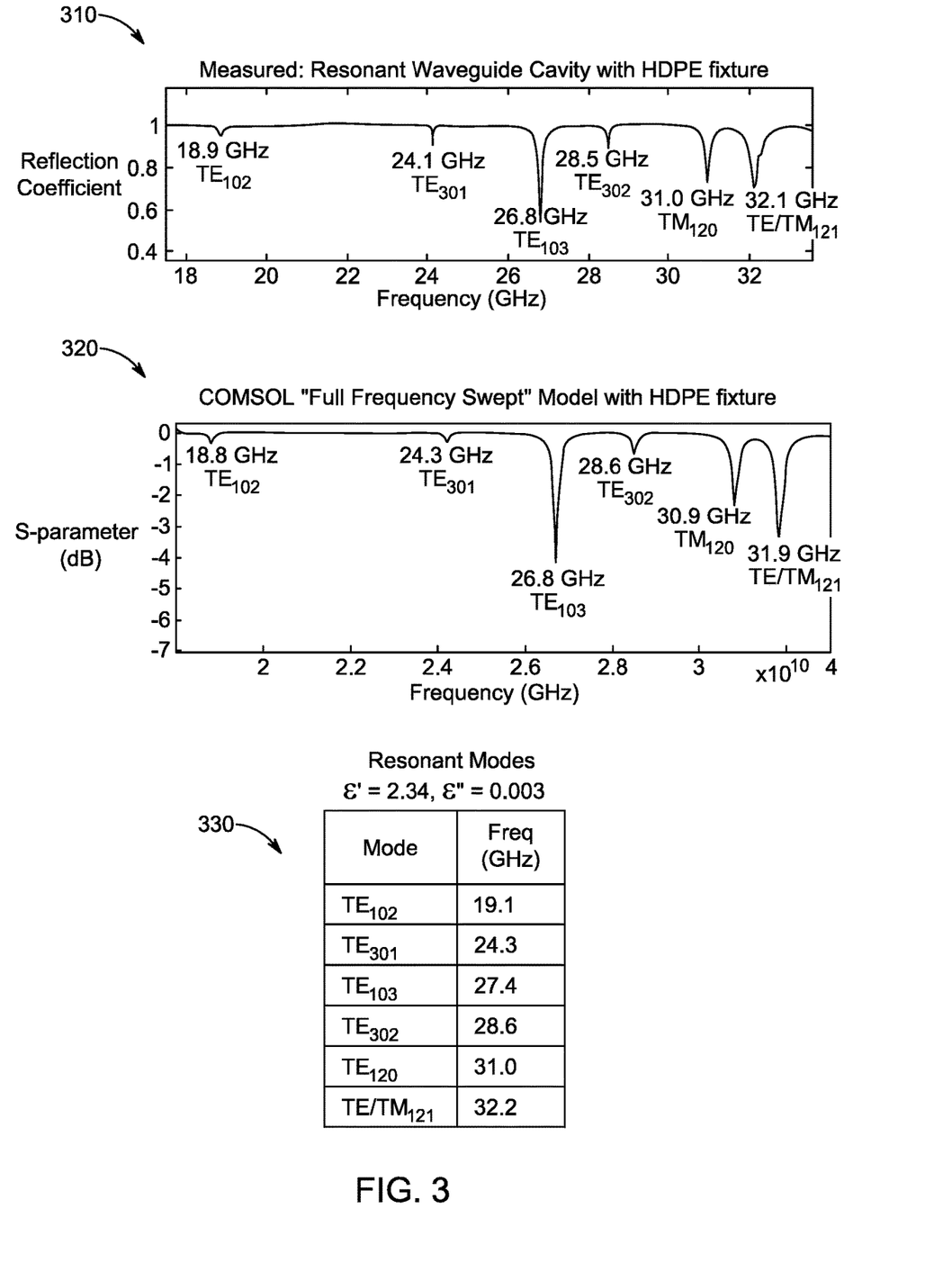
FIG. 3 depicts exemplary graphs in accordance with one or more embodiments.

At block 240, the determination engine 115 compares the measured resonant frequency with the modeled resonant frequency. FIG. 3 depicts exemplary graphs 310, 320, and 330 in accordance with one or more embodiments. The exemplary graphs 310, 320, and 330 depict a comparison of the measured resonant frequency with the modeled resonant frequency.

At block 250, the determination engine 115 conducts an analytical analysis of the Q-factor (as discussed herein). The analytical analysis of the Q-factor can be performed with respect to Equation 4, where $Q_d$ is the loss due to the permittivity of the propagating medium as defined by Equation 5, where Qw is the loss due to resistive losses in the cavity walls as defined by Equations 6, 7, 8, and 9, where Qc is the loss due to energy leaking out of input coupling aperture and is determined by Equation 10, and where a, b, and d are the dimensions of a rectangular waveguide resonant cavity (i.e., the resonant cavity 170).

$$Q_L = \left( \frac{1}{Q_d} + \frac{1}{Q_w} + \frac{1}{Q_c} \right)^{-1} \quad \text{Equation 4}$$

$$Q_d = \frac{\varepsilon'}{\varepsilon''} \quad \text{Equation 5}$$

$$Q_w = \frac{(kad)^3 b\eta}{R_S 2\pi^2 (2p^2 a^3 b + 2bd^3 + p^2 a^3 d + ad^3)} \quad \text{Equation 6}$$

$$k = \frac{2\pi f \sqrt{\varepsilon'}}{c} \quad \text{Equation 7}$$

$$\eta = \frac{376.7}{\sqrt{\varepsilon'}} \quad \text{Equation 8}$$

$$R_S = \sqrt{\frac{2\pi f \mu_0}{2\sigma}} \quad \text{Equation 9}$$

$$Q_w = \frac{0.022}{r^6} \left( \frac{b^2 a^2 d^2}{p^2} + \frac{b^2 d^4}{p^4} \right) \quad \text{Equation 10}$$

The reflection coefficient of the resonant cavity 170 can be measured using the PNA as calibrated by the determination engine 115.

Figure 4:
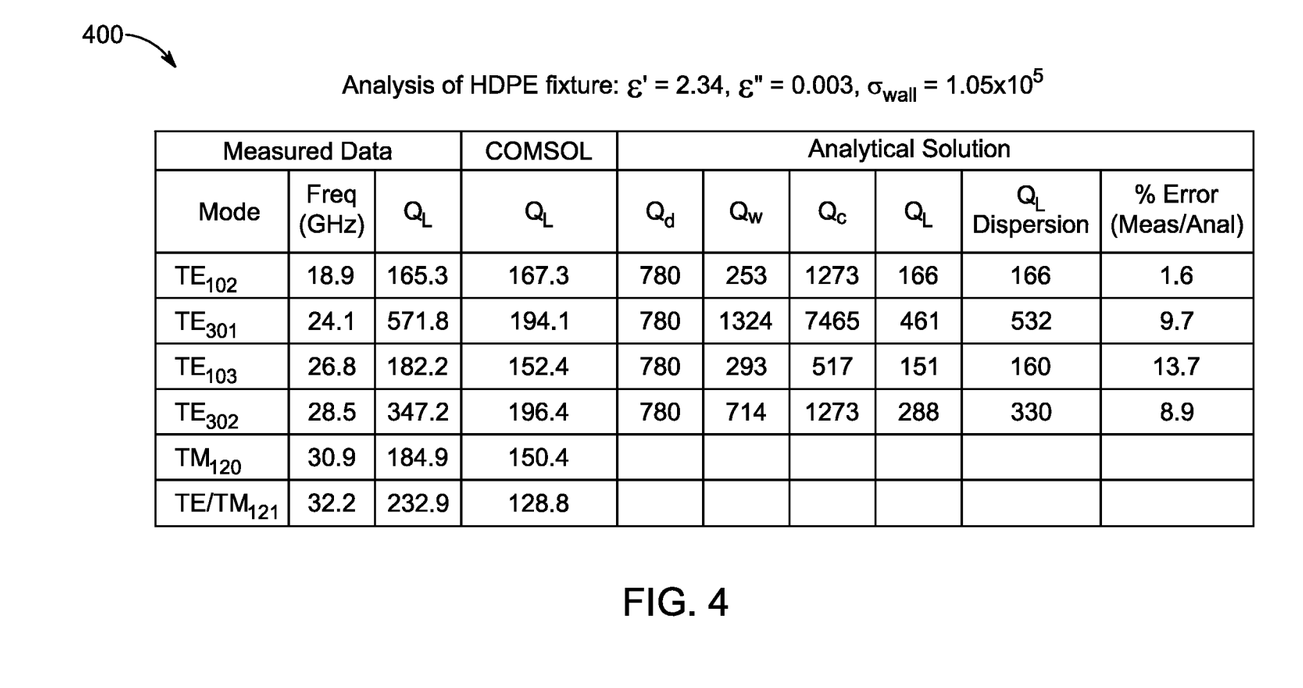
FIG. 4 depicts an exemplary chart in accordance with one or more embodiments.

At block 260, the determination engine 115 compares the measured, modeled, and analytically obtained Q-factors. FIG. 4 depicts exemplary chart 400 in accordance with one or more embodiments. The exemplary chart 400 demonstrates the comparison of the measured, modeled, and analytically obtained Q-factors.

Turning now to FIGS. 5-11, exemplary GUIs 500, 600, 700, 800, 900, 1000, and 1100 are shown in accordance with one or more embodiments. Each of the exemplary GUIs 500, 600, 700, 800, 900, 1000, and 1100 can be generated by the determination engine 115 and can be manipulated through user interactions.

Figure 5:
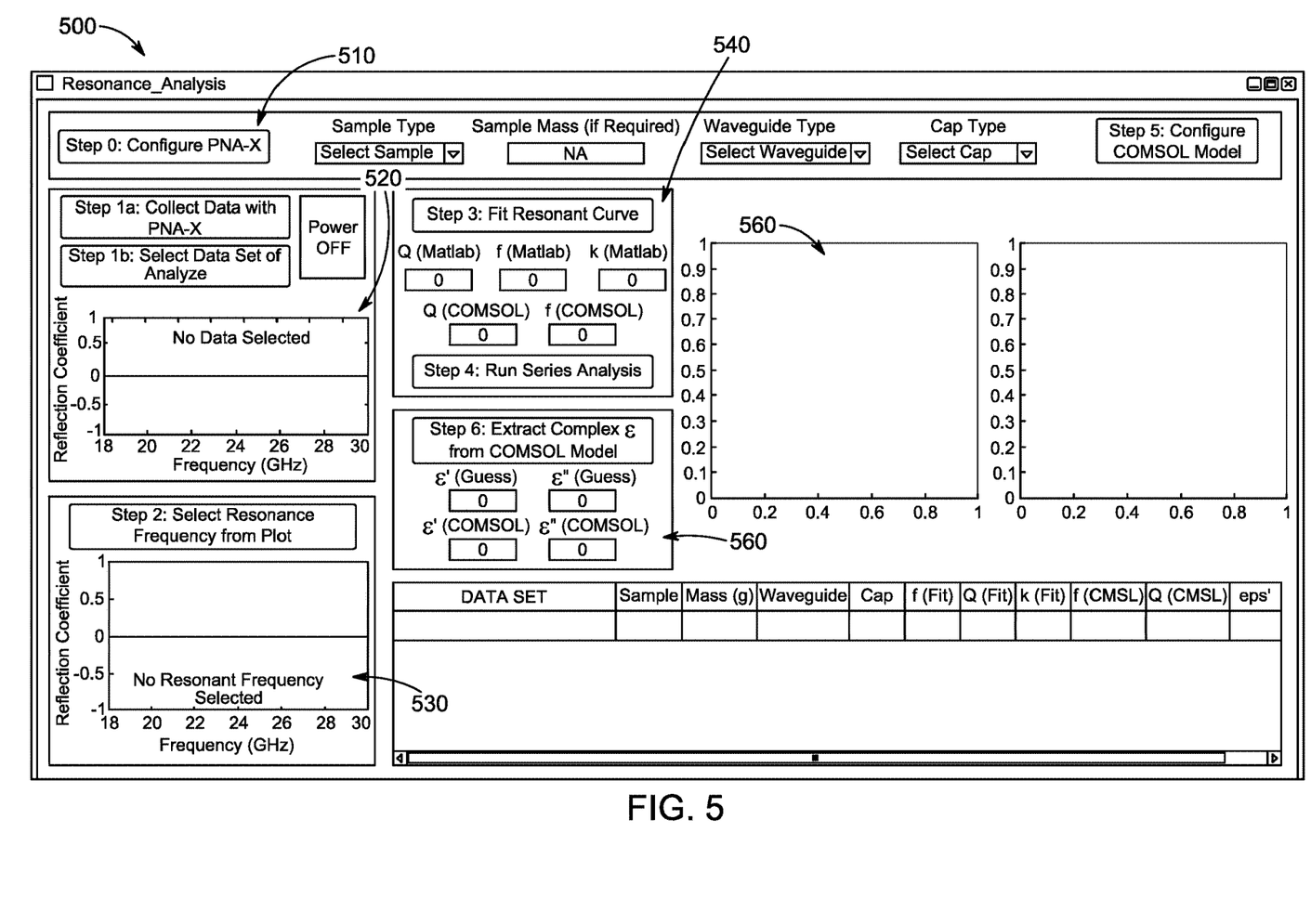
FIG. 5 depicts an exemplary graphical user interface in accordance with one or more embodiments.

Turning to the GUI 500 of FIG. 5, the GUI 500 includes a section 510 for configuring the PNA 130, a section 520 for collecting data from the PNA 130, a section 530 for selecting a particular resonance frequency, a section 540 for modeling via COMSOL and MATLAB, a section 550 for extracting the complex permittivity c values from the COMSOL model, as well as a section 560 for depicting a representation of the resonant cavity 170 and the sample 180, along with the accompanying electric field.

Figure 6:
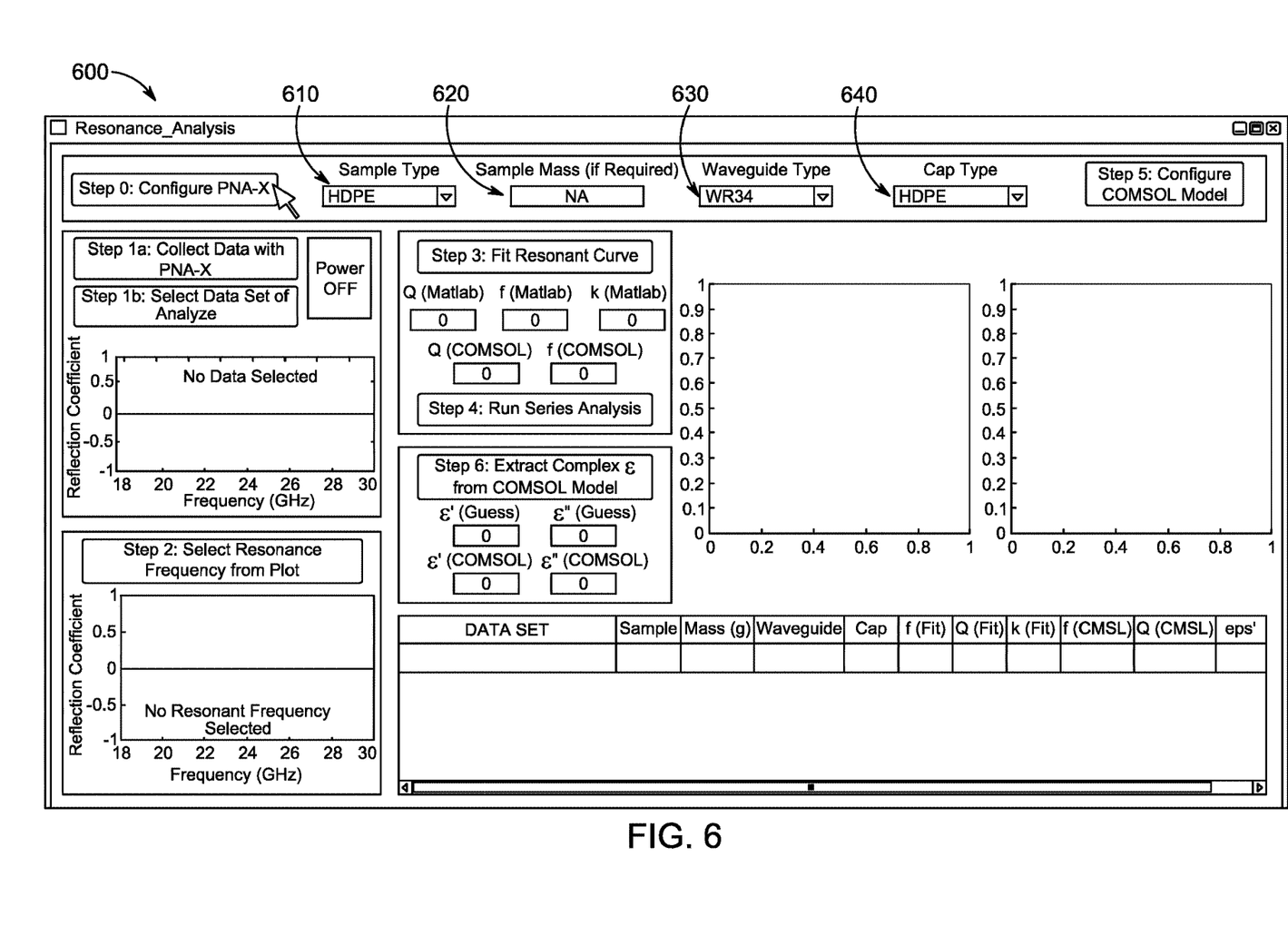
FIG. 6 depicts an exemplary graphical user interface in accordance with one or more embodiments.

Turning to the GUI 600 of FIG. 6, an exemplary process for configuring the PNA 130 within the GUI 600 is shown. The exemplary process includes a selection 610 of a sample type (e.g., HDPE), a selection 620 of a sample mass, a selection 630 of a waveguide type (e.g., WR34), and a selection 640 of a cap type (e.g., HDPE). It should be understood that one or more of the same selections can be used to configure the COMSOL model.

Figure 7:
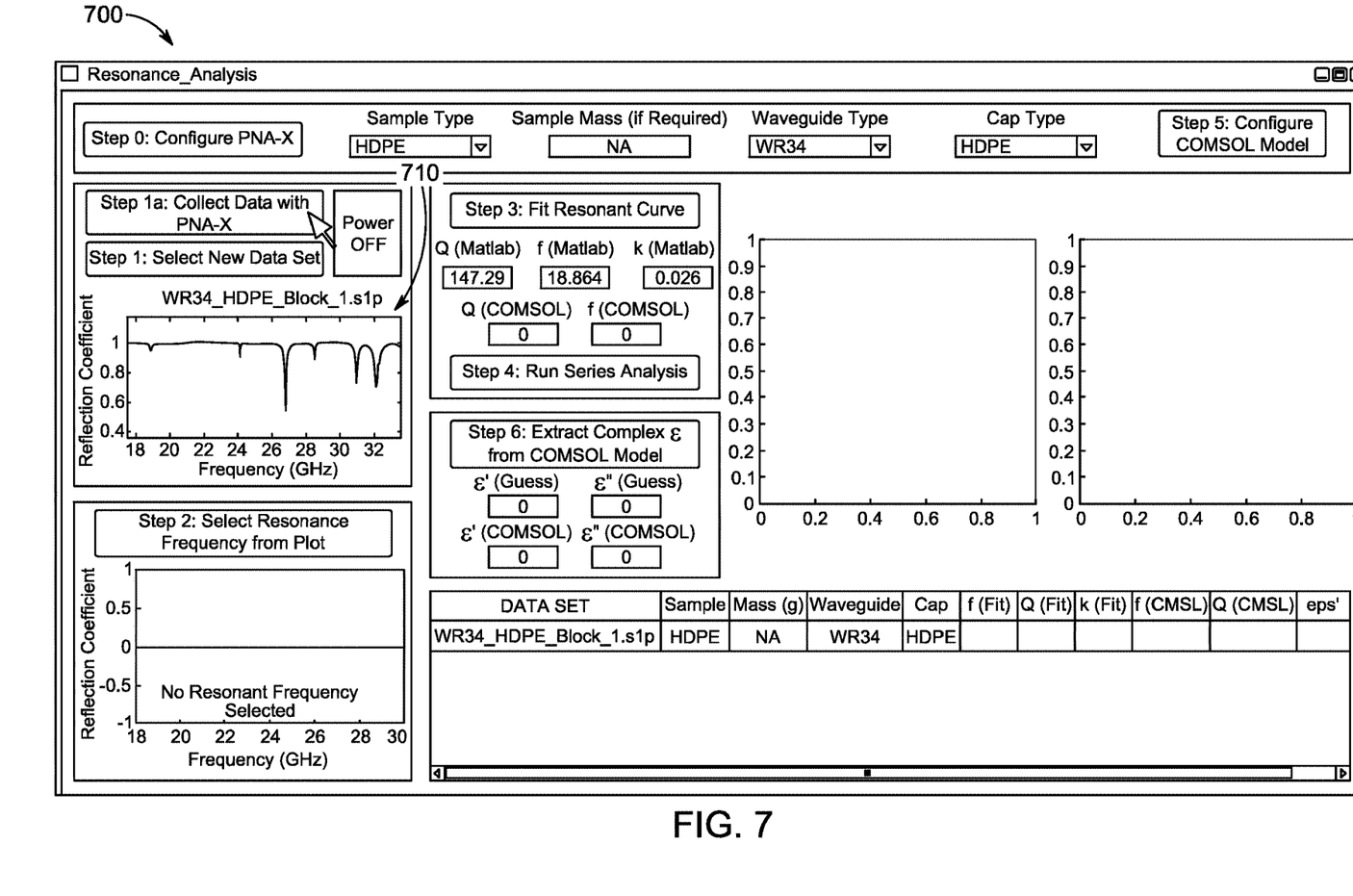
FIG. 7 depicts an exemplary graphical user interface in accordance with one or more embodiments.

Turning to the GUI 700 of FIG. 7, the collection of data from the PNA 130 within the GUI 700 is shown. The data collected from the PNA 130 is plotted on a graph 710 depicting a relationship between a reflection coefficient and a frequency within a frequency range of interest. It should be understood that the graph depicted in FIG. 7 can be analogous to a graph 310 depicted in FIG. 3. Once the data is collected, a particular representative resonant frequency can be selected for further analysis.

Figure 8:
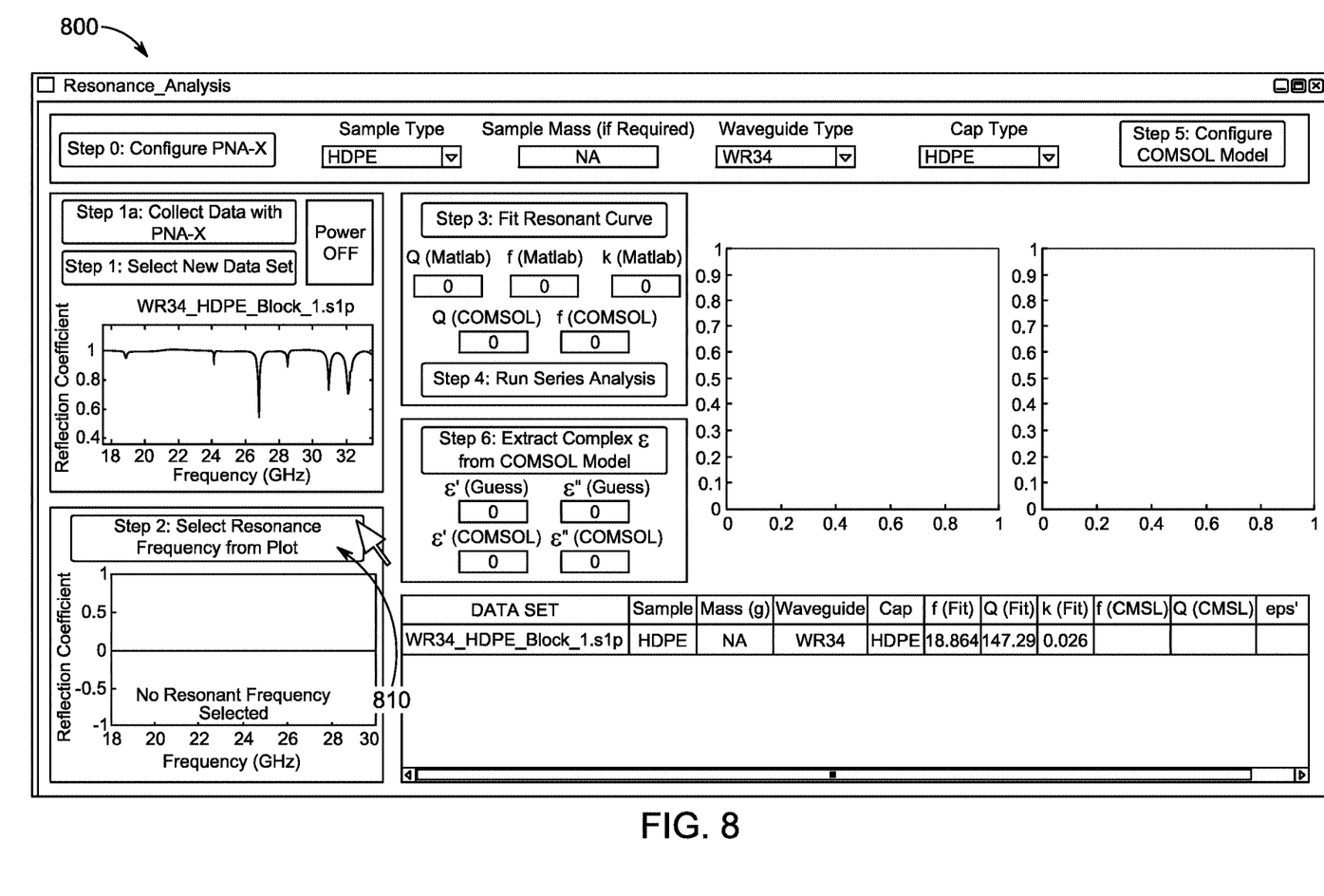
FIG. 8 depicts an exemplary graphical user interface in accordance with one or more embodiments.
Figure 9:
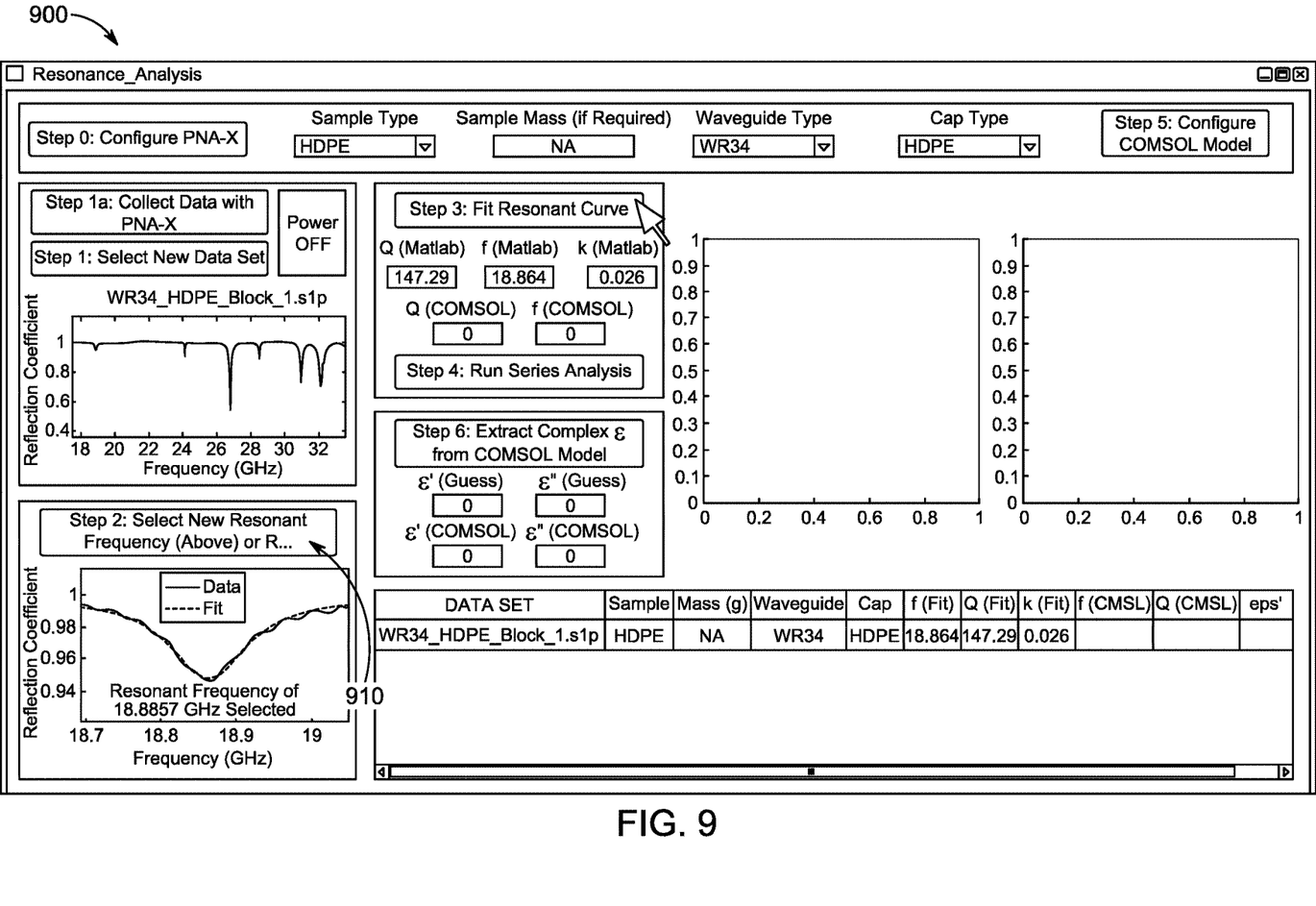
FIG. 9 depicts an exemplary graphical user interface in accordance with one or more embodiments.

Turning to the GUIs 800 and 900 of FIGS. 8-9, a selection 810 of a particular resonant frequency and a fitting 910 of a calculated resonant curve to a plot obtained from the PNA 130 is shown. The fitting is conducted through the use of COMSOL and/or MATLAB and involves the determination of the Q-factors in accordance with the formulas and relationships described herein. It should be understood that the fitting and the determination of the Q-factors occurs automatically through the integration of COMSOL and MATLAB functionality within the GUI of the embodiment.

Figure 10:
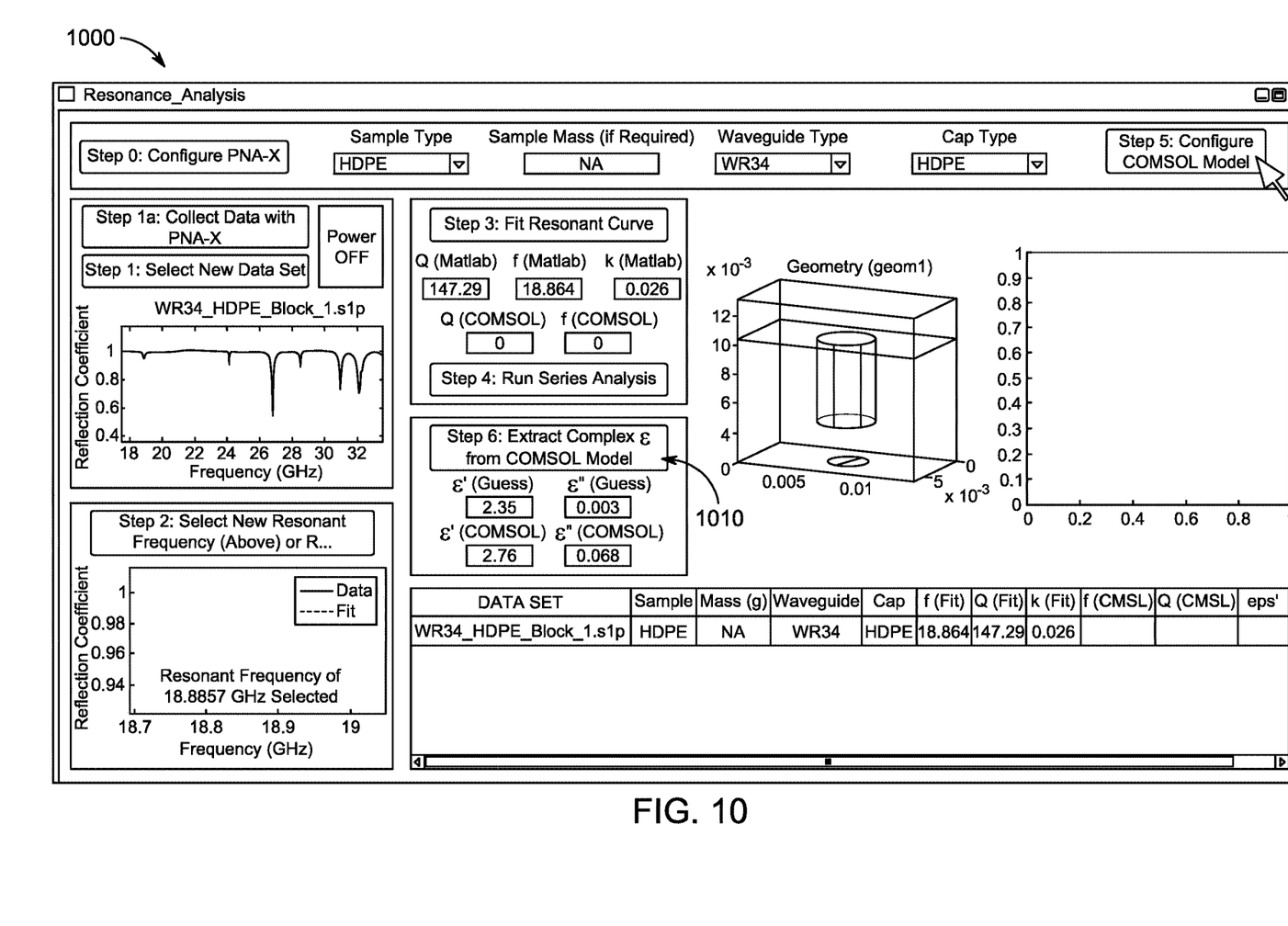
FIG. 10 depicts an exemplary graphical user interface in accordance with one or more embodiments.

Turning to the GUI 1000 of FIG. 10, an extraction 1010 of the complex permittivity ε' and ε" values are shown. The extraction of the values can occur automatically through the functionality of COMSOL integrated within the GUI and in accordance with the mathematical relationships described herein.

Figure 11:
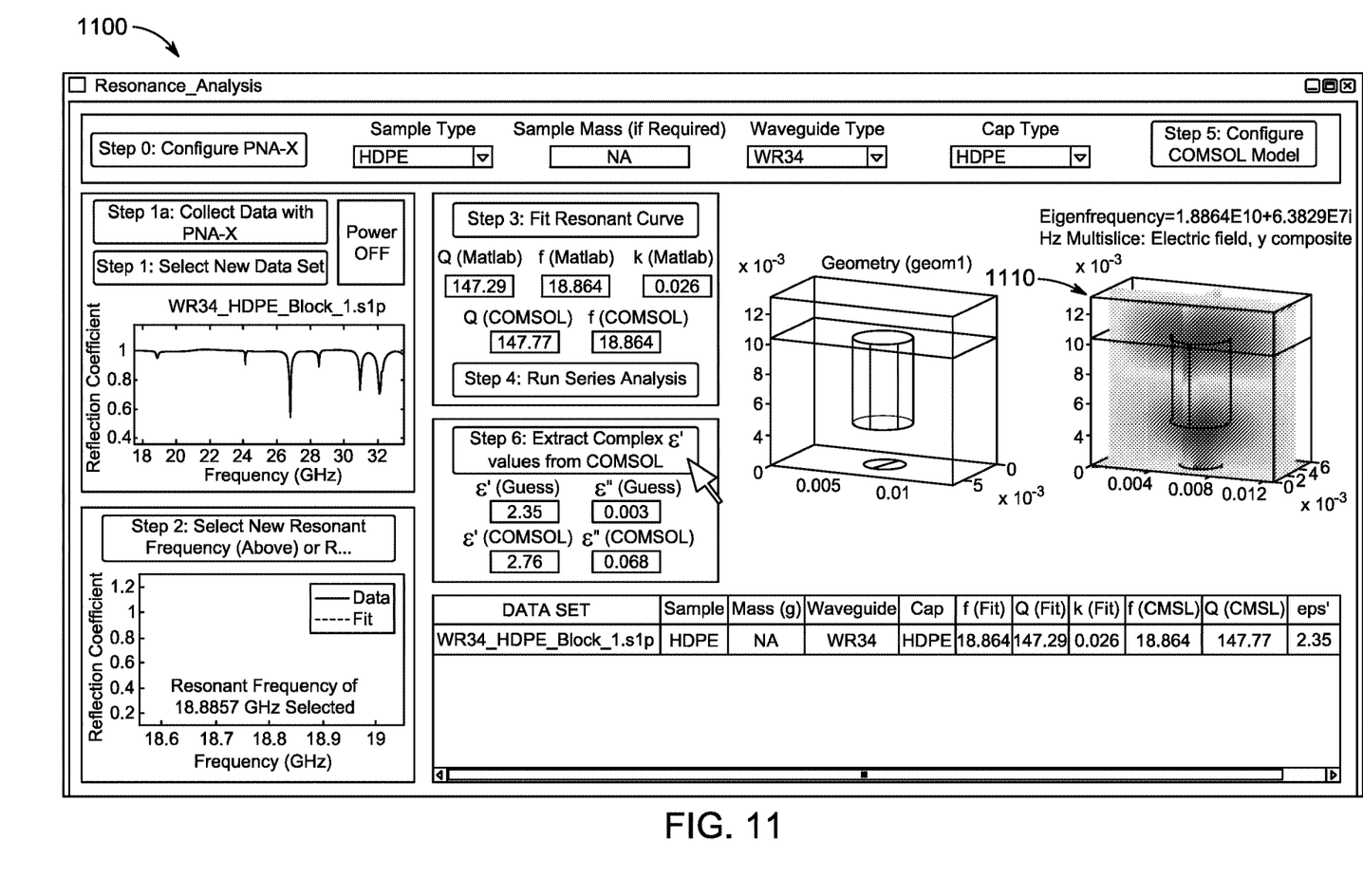
FIG. 11 is an illustration of another example graphical user interface in accordance with an embodiment.

Turning to the GUI 1100 of FIG. 11, a 3D rendering 1110 of the resonant waveguide cavity as well as the electric field around the sample corresponding to a particular eigenfrequency. It should be understood that the cavity geometry, including the input waveguide and coupling element, are programmed into electromagnetic simulation/model. The electromagnetic simulations/models provide complete solutions for the electromagnetic fields.

According to one or more embodiments, automated resonant waveguide systems and methods for measuring complex permittivity in various types of samples are provided. The automated resonant waveguide systems and methods can include a graphical user interface (GUI) provided that automates the measurement of complex permittivity in the millimeter-wave regime. Herein, reference is made to particular features of various embodiments of the invention. It is to be understood that the disclosure of embodiments herein includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments, and generally.

According to one or more embodiments, an automated resonant waveguide cavity system for determining one or complex permittivity measurements of a sample is provided. The automated resonant waveguide cavity system comprising: a resonant cavity; a waveguide coupled to the resonant cavity; a programmable network analyzer (PNA) coupled to the waveguide; a computing device comprising at least one memory storing processor executable code for a determination engine and at least one processor executing the processor executable code to cause the determination engine to: obtain data from the PNA, the data being respective to the sample within the resonant cavity, and integrate a plurality of analytical and modeling functions in determining the one or more complex permittivity values of the sample from the data According to one or more embodiments or any of the system embodiments herein, the determination engine can generate and operate a graphical user interface (GUI) comprising a plurality of sections that provide interactive elements that control and configure the PNA.

According to one or more embodiments or any of the system embodiments herein, the determination engine can determine, as measurements, the one or more complex permittivity values of the sample in a millimeter-wave regime and provides the measurements for display by the GUI.

According to one or more embodiments or any of the system embodiments herein, the computing device can include a display for presenting the GUI.

According to one or more embodiments or any of the system embodiments herein, the determination engine can import the data from the PNA into a simulation software of the plurality of analytical and modeling functions and automatically transmit an output of the simulation software into a computing platform of the plurality of analytical and modeling function.

According to one or more embodiments or any of the system embodiments herein, the resonant cavity can be dimensionally rectangular and can be configured to contain the sample on a centered coupling element in an plane of the resonant cavity.

According to one or more embodiments or any of the system embodiments herein, the resonant cavity can include a plastic fixture that encapsulate the sample in a center region of the resonant cavity.

According to one or more embodiments or any of the system embodiments herein, the determination engine can determine a reflection coefficient with the PNA.

According to one or more embodiments or any of the system embodiments herein, the determination engine can extract a resonant frequency and a Q-factor of the sample using a simulation software of the plurality of analytical and modeling functions.

According to one or more embodiments or any of the system embodiments herein, the determination engine can transmit a resonant frequency and a Q-factor to into a computing platform of the plurality of analytical and modeling functions.

According to one or more embodiments, a method for determining one or more complex permittivity values of a sample is provided. The method is implemented by a determination engine stored as processor executable code in a memory of a computing device. The processor executable code is executed by at least one processor of the computing device. The method includes obtaining data from a programmable network analyzer (PNA) coupled to a waveguide and a resonant cavity. The data is respective to the sample within the resonant cavity. The method includes integrating a plurality of analytical and modeling functions in determining the one or more complex permittivity values of the sample from the data.

According to one or more embodiments or any of the method embodiments herein, the determination engine can generate and operate a graphical user interface (GUI) comprising a plurality of sections that provide interactive elements that control and configure the PNA.

According to one or more embodiments or any of the method embodiments herein, the determination engine can determine, as measurements, the one or more complex permittivity values of the sample in a millimeter-wave regime and provides the measurements for display by the GUI.

According to one or more embodiments or any of the method embodiments herein, the computing device can include a display for presenting the GUI.

According to one or more embodiments or any of the method embodiments herein, the determination engine can import the data from the PNA into a simulation software of the plurality of analytical and modeling functions and automatically transmit an output of the simulation software into a computing platform of the plurality of analytical and modeling function.

According to one or more embodiments or any of the method embodiments herein, the resonant cavity can be dimensionally rectangular and can be configured to contain the sample on a centered coupling element in an plane of the resonant cavity.

According to one or more embodiments or any of the method embodiments herein, the resonant cavity can include a plastic fixture that encapsulate the sample in a center region of the resonant cavity.

According to one or more embodiments or any of the method embodiments herein, the determination engine can determine a reflection coefficient with the PNA.

According to one or more embodiments or any of the method embodiments herein, the determination engine can extract a resonant frequency and a Q-factor of the sample using a simulation software of the plurality of analytical and modeling functions.

According to one or more embodiments or any of the method embodiments herein, the determination engine can transmit a resonant frequency and a Q-factor into a computing platform of the plurality of analytical and modeling functions.

According to one or more embodiments, an automated resonant waveguide cavity system for complex permittivity measurements is provided. The automated resonant waveguide cavity system includes a programmable network analyzer (PNA) coupled to a waveguide having a resonant cavity at one end. The resonant cavity contains a sample of material. The automated resonant waveguide cavity system also includes a computing system that operates a program controllable by a graphical user interface (GUI) integrating a plurality of analytical and modeling functions. The GUI includes a plurality of sections that each respectively control the PNA, obtain data from the PNA, display determinations of Q-factors and permittivity values, and depict a three dimensional electromagnetic diagram.

According to one or more embodiments, a method for automatically measuring complex permittivity of a sample with a resonant waveguide cavity system is provided. The method includes receiving data from a programmable network analyzer (PNA) coupled to a waveguide having a resonant cavity at one end. The resonant cavity contains a sample of material. The method also includes receiving transmitting the data to a computing system configured with a graphical user interface (GUI) integrating a plurality of analytical and modeling functions, modeling a reflection coefficient; displaying determinations of Q-factors and permittivity values within the GUI; and depicting a three-dimensional electromagnetic diagram within the GUI.

Having described embodiments of a system and method (which are intended to be illustrative and not limiting), it is noted that modifications and variations can be made by persons skilled in the art in light of the teachings herein. It is therefore to be understood that changes may be made in the particular embodiments disclosed which are within the scope of the invention as outlined by the appended claims.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

Throughout this specification and elsewhere, diagrams and illustrations depict methods, apparatuses (e.g., systems), and computer program products. Each element of the diagrams and illustrations, as well as each respective combination of elements in the diagrams and illustrations, may illustrate a function of the methods, apparatuses, and computer program products. Any and all such functions ("depicted functions") can be implemented by computer program instructions; by special-purpose, hardware-based computer systems; by combinations of special purpose hardware and computer instructions; by combinations of general-purpose hardware and computer instructions; and so on— any and all of which may be generally referred to herein as a "component", "module," or "system."

The functions, systems and methods herein described could be utilized and presented in a multitude of languages. Individual systems may be presented in one or more languages and the language may be changed with ease at any point in the process or methods described herein. One of ordinary skill in the art would appreciate that there are numerous languages the system could be provided in, and embodiments of the invention are contemplated for use with any language.

Various features may be described as being optional, for example, through the use of the verb "may", or, through the use of any of the phrases: "in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although features and elements are described herein in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. A computer readable medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire Examples of computer-readable media include electrical signals (transmitted over wired or wireless connections) and computer-readable storage media. Examples of computer-readable storage media include, but are not limited to, a register, cache memory, semiconductor memory devices, magnetic media such as internal hard disks and removable disks, magneto-optical media, optical media such as compact disks (CD) and digital versatile disks (DVDs), a random access memory (RAM), a read-only memory (ROM), an erasable programmable read-only memory (EPROM or Flash memory), a static random access memory (SRAM), and a memory stick. A processor in association with software may be used to implement a radio frequency transceiver for use in a terminal, base station, or any host computer.

The term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

What is claimed is:

1. An automated resonant waveguide cavity system for determining one or more complex permittivity measurements of a sample, the automated resonant waveguide cavity system comprising:
    a resonant cavity;
    a waveguide coupled to the resonant cavity;
    a programmable network analyzer (PNA) coupled to the waveguide;
    a computing device comprising at least one memory storing processor executable code for a determination engine and at least one processor executing the processor executable code to cause the determination engine to:
        obtain data from the PNA, the data being respective to the sample within the resonant cavity, and
        integrate a plurality of analytical and modeling functions in determining the one or more complex permittivity values of the sample from the data.

2. The automated resonant waveguide cavity system of claim 1, wherein the determination engine generates and operates a graphical user interface (GUI) comprising a plurality of sections that provide interactive elements that control and configure the PNA.

3. The automated resonant waveguide cavity system of claim 2, wherein the determination engine determines, as measurements, the one or more complex permittivity values of the sample in a millimeter-wave regime and provides the measurements for display by the GUI.

4. The automated resonant waveguide cavity system of claim 2, wherein the computing device comprises a display for presenting the GUI.

5. The automated resonant waveguide cavity system of claim 2, wherein the determination engine imports the data from the PNA into a simulation software of the plurality of analytical and modeling functions and automatically transmit an output of the simulation software into a computing platform of the plurality of analytical and modeling function.

6. The automated resonant waveguide cavity system of claim 1, wherein the resonant cavity is dimensionally rectangular and is configured to contain the sample on a centered coupling element in an plane of the resonant cavity.

7. The automated resonant waveguide cavity system of claim 1, wherein the resonant cavity comprises a plastic fixture that encapsulate the sample in a center region of the resonant cavity.

8. The automated resonant waveguide cavity system of claim 1, wherein the determination engine determines a reflection coefficient with the PNA.

9. The automated resonant waveguide cavity system of claim 1, wherein the determination engine extracts a resonant frequency and a Q-factor of the sample using a simulation software of the plurality of analytical and modeling functions.

10. The automated resonant waveguide cavity system of claim 1, wherein the determination engine transmits a resonant frequency and a Q-factor to into a computing platform of the plurality of analytical and modeling functions.

11. A method for determining one or more complex permittivity values of a sample, the method implemented by a determination engine stored as processor executable code in a memory of a computing device, and the processor executable code being executed by at least one processor of the computing device, the method comprising:
    obtaining data from a programmable network analyzer (PNA) coupled to a waveguide and a resonant cavity, the data being respective to the sample within the resonant cavity; and
    integrating a plurality of analytical and modeling functions in determining the one or more complex permittivity values of the sample from the data.

12. The method of claim 11, wherein the determination engine generates and operates a graphical user interface (GUI) comprising a plurality of sections that provide interactive elements that control and configure the PNA.

13. The method of claim 12, wherein the determination engine determines, as measurements, the one or more complex permittivity values of the sample in a millimeter-wave regime and provides the measurements for display by the GUI.

14. The method of claim 12, wherein the computing device comprises a display for presenting the GUI.

15. The method of claim 12, wherein the determination engine imports the data from the PNA into a simulation software of the plurality of analytical and modeling functions and automatically transmit an output of the simulation software into a computing platform of the plurality of analytical and modeling function.

16. The method of claim 11, wherein the resonant cavity is dimensionally rectangular and is configured to contain the sample on a centered coupling element in an plane of the resonant cavity.

17. The method of claim 11, wherein the resonant cavity comprises a plastic fixture that encapsulate the sample in a center region of the resonant cavity.

18. The method of claim 11, wherein the determination engine determines a reflection coefficient with the PNA.

19. The method of claim 11, wherein the determination engine extracts a resonant frequency and a Q-factor of the sample using a simulation software of the plurality of analytical and modeling functions.

20. The method of claim 11, wherein the determination engine transmits a resonant frequency and a Q-factor to into a computing platform of the plurality of analytical and modeling functions.

* * * * *